United States Patent
Ong et al.

(10) Patent No.: US 9,159,714 B2
(45) Date of Patent: Oct. 13, 2015

(54) PACKAGE ON WIDE I/O SILICON

(71) Applicant: Intel Corporation, Santa Clara, CA (US)

(72) Inventors: Jenny Shio Yin Ong, Bayan Lepas (MY); Choong Kooi Chee, Balik Pulau (MY); Seok Ling Lim, Kulim (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/040,642

(22) Filed: Sep. 28, 2013

(65) Prior Publication Data

US 2015/0091180 A1  Apr. 2, 2015

(51) Int. Cl.
| | |
|---|---|
| *H01L 23/48* | (2006.01) |
| *H01L 25/18* | (2006.01) |
| *H01L 25/00* | (2006.01) |
| *H01L 23/538* | (2006.01) |
| *H01L 23/498* | (2006.01) |
| *H01L 23/14* | (2006.01) |

(52) U.S. Cl.
CPC .......... *H01L 25/18* (2013.01); *H01L 23/49811* (2013.01); *H01L 23/49822* (2013.01); *H01L 23/49827* (2013.01); *H01L 23/538* (2013.01); *H01L 25/50* (2013.01); *H01L 23/147* (2013.01); *H01L 23/5389* (2013.01); *H01L 2224/16225* (2013.01)

(58) Field of Classification Search
USPC .......... 257/774, 777, 678, 686, 700, E23.001, 257/E23.085
See application file for complete search history.

(56) References Cited

U.S. PATENT DOCUMENTS

2008/0315388 A1* 12/2008 Periaman et al. ............. 257/690
2011/0156231 A1*  6/2011 Guzek ............................ 257/686

\* cited by examiner

*Primary Examiner* — Timor Karimy
(74) *Attorney, Agent, or Firm* — Blakely, Sokoloff, Taylor & Zafman LLP (57) ABSTRACT

An apparatus including a die including a device side and an opposite backside, first contacts on the backside and a through vias from the device side to the first contacts and second contacts on the backside of the die or on at least two opposing sidewalls of the die; a secondary die coupled to the first plurality of contacts; and a carrier including carrier contact points operable for mounting the carrier to a substrate. A method including forming a first portion of a carrier adjacent a device side of a die and including carrier contact points operable for mounting the carrier to a substrate; and forming a second portion including second carrier contact points connected to contacts on the backside of the die or on at least two opposing sidewalls of the die; and coupling a secondary die to the second carrier contact points.

12 Claims, 11 Drawing Sheets

PACKAGE ON WIDE I/O SILICON

FIELD

Packaging and microelectronic device assembly.

BACKGROUND

In an effort to improve interconnect speed, decrease power consumption and reduce integrated circuit package form factor, three-dimensional packages with die-to-die stacking has been promoted.

Die-to-die stacking minimizes the effort to place all technologies on a single die. Instead, multiple dies may be stacked together. Such dies may allow a different fabrication technology optimized for a particular type of circuitry, such as memory, logic, analog and sensors. Wide I/O memory is a recent dynamic random access memory (DRAM) technology that contemplates a memory die stacked on a microprocessor die or vice versa. JEDEC standard JESD229, "Wide I/O Single Data Rate," December 2011, specifies four 128-bit channels, providing a 512-bit interface to DRAM. An interface between the dice involves, in one embodiment, solder connections.

DETAILED DESCRIPTION

Described herein are embodiments of packages including one or more dice connected to a second die or dice and a third die or dice through, for example, a package or package (POP) arrangement. Bumpless build-up layer (BBUL) technology is one approach to a packaging architecture. Among its advantages, BBUL eliminates the need for assembly, eliminates prior solder ball interconnections (e.g., flip-chip interconnections), reduces stress on low-k interlayer dielectric of dies due to die-to-substrate coefficient of thermal expansion (CTE) mismatch, and reduces package inductions through elimination of core and flip-chip interconnect for improved input/output (I/O) and power delivery performance.

Typical of BBUL technology is a die or dies embedded in a substrate, which then has one or more build-up layers formed thereon. Processes such as laser drilling, lithography and plating may be used for via formation to contacts on the die or dice and to form patterned conductive material lines or traces. Alternating layers of patterned conductive material are separated by insulating material typically applied as a film.

Figure 1:
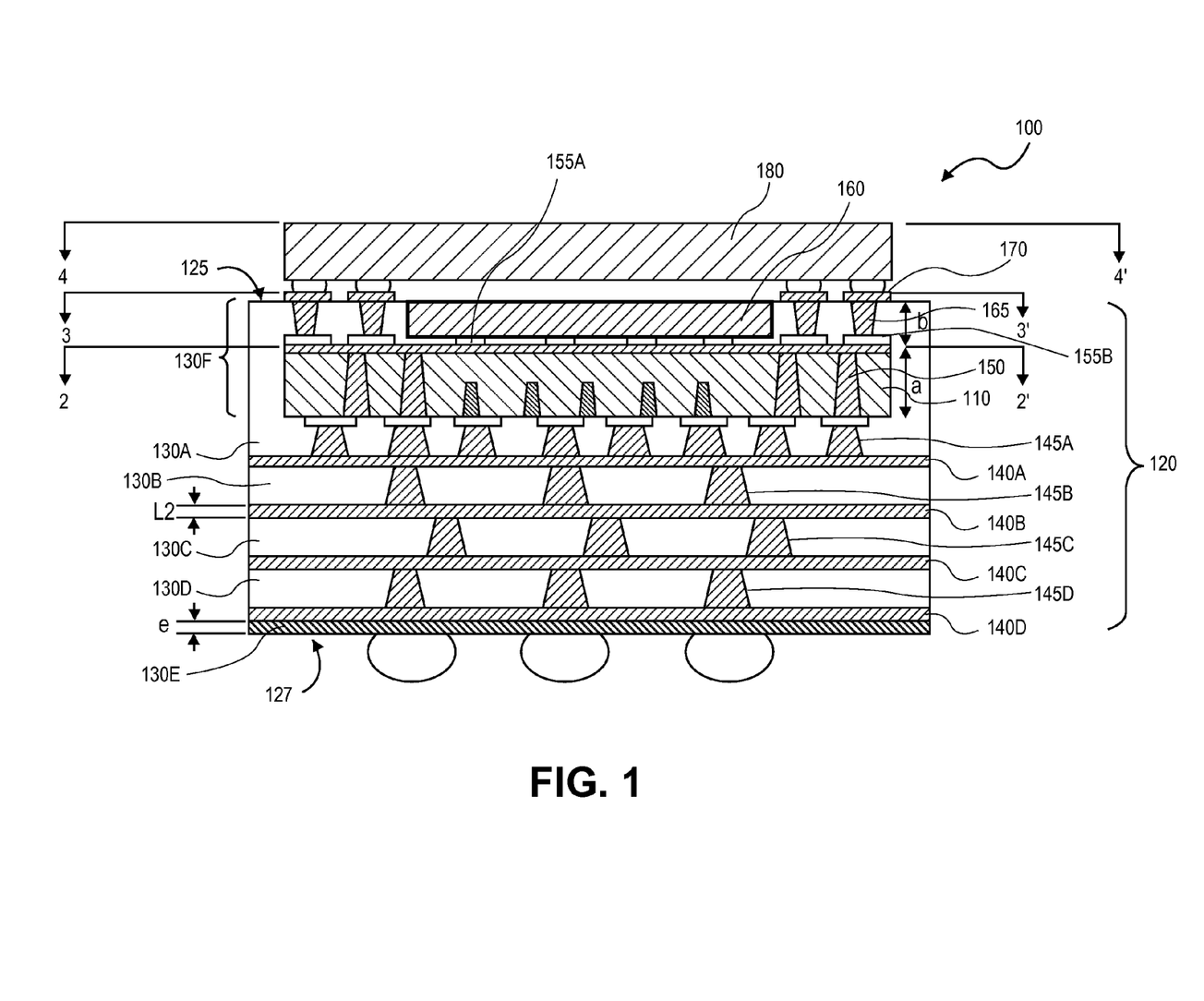
FIG. 1 shows a cross-sectional side view of an embodiment of a microelectronic package.

FIG. 1 shows a cross-sectional side view of a microelectronic package according to one embodiment. As illustrated in FIG. 1, microelectronic package 100 utilizes bumpless build-up layer (BBUL) technology. Microelectronic package 100 includes carrier 120 having surface 125 and opposing surface 127. Die 110, such as a microprocessor die (e.g., a system on chip die) is embedded in carrier 120. In this manner, die 110 and carrier 120 are in direct physical contact with each other (e.g., there are no solder bumps connecting die 110 to carrier 120). Die 110 is directly connected to carrier 120 at its device side (device side down as viewed). Carrier 120 may include multiple build-up layers of conductive material (e.g., patterned conductive lines or traces) separated by dielectric material. The layer(s) of conductive material provide connectivity to the die (power, ground input/output, etc.). FIG. 1 shows four layers of conductive material (conductive material 140A, conductive material 140B, conductive material 140C and conductive material 140D) disposed between five layers of dielectric material (dielectric material 130A, dielectric material 130B, dielectric material 130C, dielectric material 130D and dielectric material 130E). The various conductive layers are connected to die 110 (e.g., to contact points on a device side of die 110) and to one another where desired by conductive vias (conductive vias 145A, conductive vias 145B, conductive vias 145C and conductive vias 145D).

In the embodiment shown in FIG. 1, die 110 is a through-silicon via (TSV) die. FIG. 1 shows die 110 having conductive vias 150 that extend from a device side of the die to the contacts on a backside of the die. In this manner, a second device such as a logic device or memory device may be connected to die 110 through the contacts on the backside of the die. In one embodiment, a portion of the contacts (contacts 155A) are arranged and configured for connection to (operable to connect to) a memory die in a wide I/O configuration. FIG. 1 shows second device 160 that is a dynamic random access memory (DRAM) die that, in one embodiment, is connected to contacts 155A on a backside of die 110 in a wide I/O memory configuration. The connection is representatively by way of solder material.

In addition to the ability to connect a second device such as a memory die to a backside of die 110, in the embodiment shown in FIG. 1, additional contacts 155B on a backside of die 110 may be used to connect a third device. As shown in FIG. 1, carrier 120 includes contacts 170 on surface 125. In this embodiment, contacts 170 are connected to contacts 155B on the backside of die 110 that are connected to a device side of die 110 through TSVs. In this embodiment, carrier 120 includes dielectric material 130F that embeds die 110 and at least the opposing sides of second device 160 and defines surface 125. As shown, die 110 has a thickness (a z-height of sidewall portions) denoted as "a" and second device has a thickness (a z-height of sidewall portions) denoted as "b". Thus, dielectric material 130F has a thickness "a" plus "b". In one embodiment, dielectric material 130F is a material such as ABF applied as a film or films. Conductive through vias 165 are between respective ones of contacts 155B on a backside of die 110 and contacts 170 on surface 125. Contacts 170 allow for the connection of a third device such as a memory die or package or several devices (e.g., stacked devices). FIG. 1 shows third device 180 that is, for example, a dynamic random access memory (DRAM) device. In an embodiment where device 180 is encompassed in a package, a package-on-package (POP) configuration is described.

Figure 2:
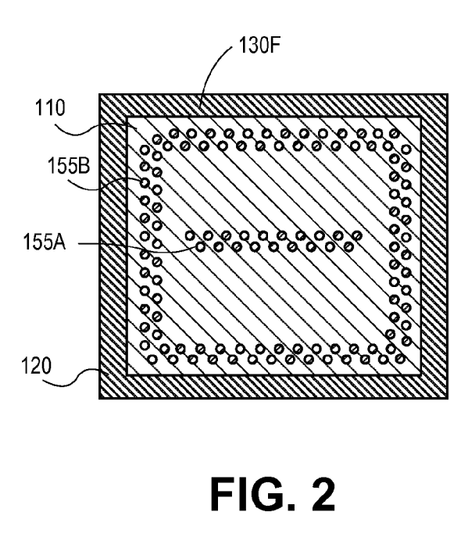
FIG. 2 shows a top view of the microelectronic package of FIG. 1 through line 2-2'.

FIG. 2 shows a top view of structure 100 through line 2-2' of FIG. 1. FIG. 2 shows contacts 155A and contacts 155B on a backside of die 110. Contacts 155A and contacts 155B are connected to through-substrate vias (conductive vias 150) to a device side of die 110. FIG. 2 shows contacts 155A aligned and suitable for connection to second device 160 (see FIG. 1). In one embodiment, contacts 155A are operable or configured to connect a second device that is a memory device such as a wide I/O memory configuration. FIG. 2 also shows contacts 155B disposed around a periphery or perimeter of a backside of die 110. Contacts 155B are suitable, in one embodiment, for connecting to a third device or package.

Figure 3:
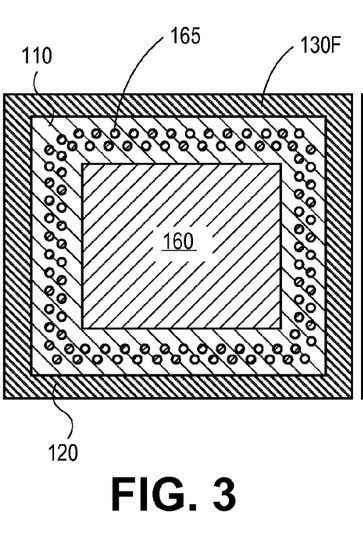
FIG. 3 shows a top view through line 3-3' of FIG. 1.
Figure 4:
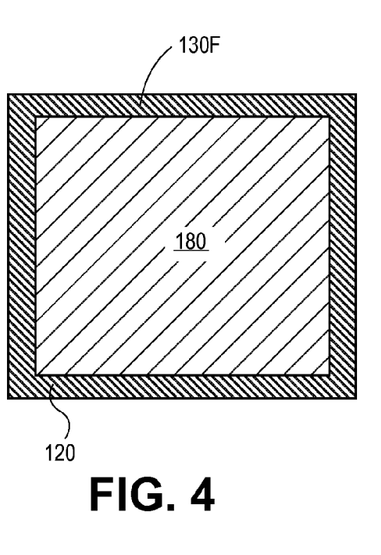
FIG. 4 shows a top view through line 4-4' of FIG. 1.

FIG. 3 shows the structure of FIG. 1 through line 3-3'. In this embodiment, second device 160, such as a DRAM memory die, is connected to die 110 through contacts 155A on a backside of die 110. FIG. 4 shows the structure of FIG. 1 through line 4-4'. FIG. 4 shows third device 180, such as a memory die or a package connected to die 110 through contacts 170 on a backside of die 110.

FIGS. 5-8 describe an embodiment for forming a microelectronic package, such as microelectronic package 100 (FIG. 1) including one or more devices connected thereto.

Figure 5:
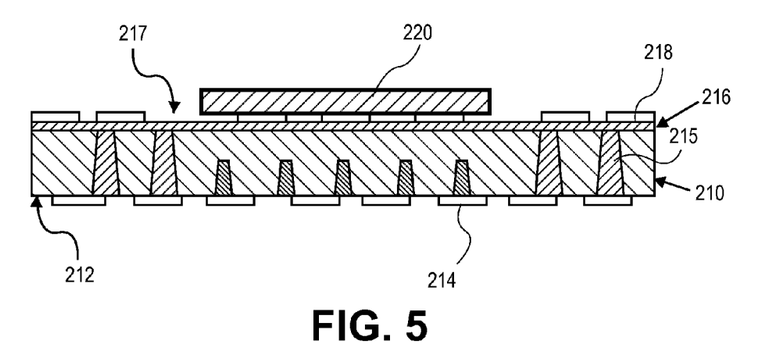
FIG. 5 shows a side view of a through-silicon via (TSV) die and a second device connected to the backside of the die.

Referring to FIG. 5, FIG. 5 shows a side view of die 210 with contact points 214 on device side 212 of die 210 and contact pads 218 on die backside 217. FIG. 5 illustrates through-substrate vias 215 extending from device side 212 to die backside 217. Die backside 217, in this embodiment, includes metal routing layer 216 and contact pads 218. In this embodiment, second device 220, such as a wide I/O memory die is connected to a portion of the contact pads 218 on a backside representatively by solder material connection.

Figure 6:
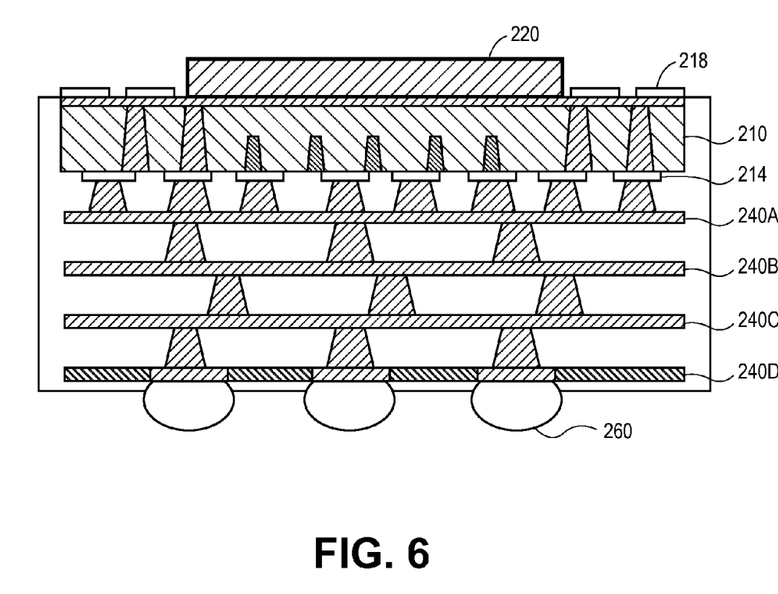
FIG. 6 shows the structure of FIG. 5 following the formation of a portion of a package on a device side of the die.

FIG. 6 shows the structure of FIG. 5 following the formation of a portion of a package on device side 212 of die 210. In one embodiment, the package portion includes four layers of conductive material (e.g., conductive traces) each separated by dielectric material to provide conductivity to die 110 and link die 110 to an external device or structure (e.g., a printed circuit board). A BBUL process may be used to form the conductive material layers. FIG. 6 shows four conductive layers, lines or traces (conductive material 240A, conductive material 240B, conductive material 240C and conductive material 240D) built up from a device side (device side 212) of die 210. In one embodiment of a BBUL process, a film of dielectric material such as an ABF is initially introduced on device side 212 of die 210. Laser vias are then drilled through the dielectric material to contact points or pads 214 of die 210. The vias are then desmeared and electroless copper is introduced on a surface of the dielectric material. A sacrificial material such as a dry film resist is then introduced and patterned on the electroless copper to define a routing layer or traces (routing layer or traces of conductive material 240A). The sacrificial material is then stripped followed by a flash etch to remove electroless copper between traces. The above-described sequence is carried out multiple times until all desired build-up layers are completed (e.g., layers of conductive material 240B, conductive material 240C and conductive material 240D are introduced and patterned). Following the last layer of patterned conductive material (conductive material 240D), a solder resist film may be laminated and then patterned using lithography techniques to define openings for solder material. FIG. 6 shows the structure including solder material 260 connected to the structure.

Figure 7:
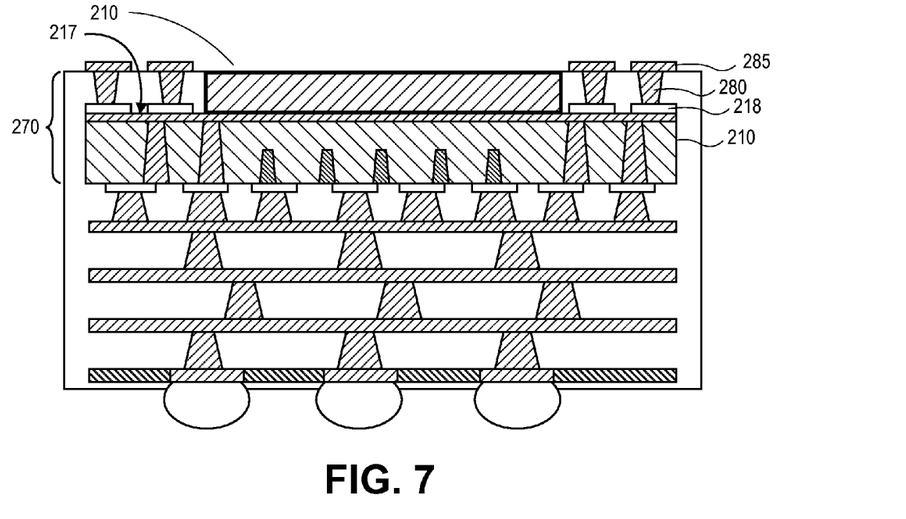
FIG. 7 shows the structure of FIG. 6 following the introduction of build-up layers on or to a die backside to create contact points for a device or package.

FIG. 7 shows the structure of FIG. 6 following the introduction of build-up layers on or to a die backside to create contact points for a device or package. In one embodiment, a dielectric material is introduced to embed die 210 (e.g., dielectric material introduced to a thickness of die 210 defined by a height of the sidewall). As shown in FIG. 7, film or films 270 of dielectric material (e.g., ABF material) extends onto a backside of die 210 and embed each of the opposing sidewalls of second device 220 (e.g., film 270 has a thickness at least equal to a thickness of second device 220).

Following the introduction of film 270, laser vias may be drilled into film 270 to form openings to contact points or pads 218 on backside 217 of die 210. Conductive vias 280 and contact pads 285 may be formed on a surface of film 270 in a manner such as described previously for defining routing traces.

Figure 8:
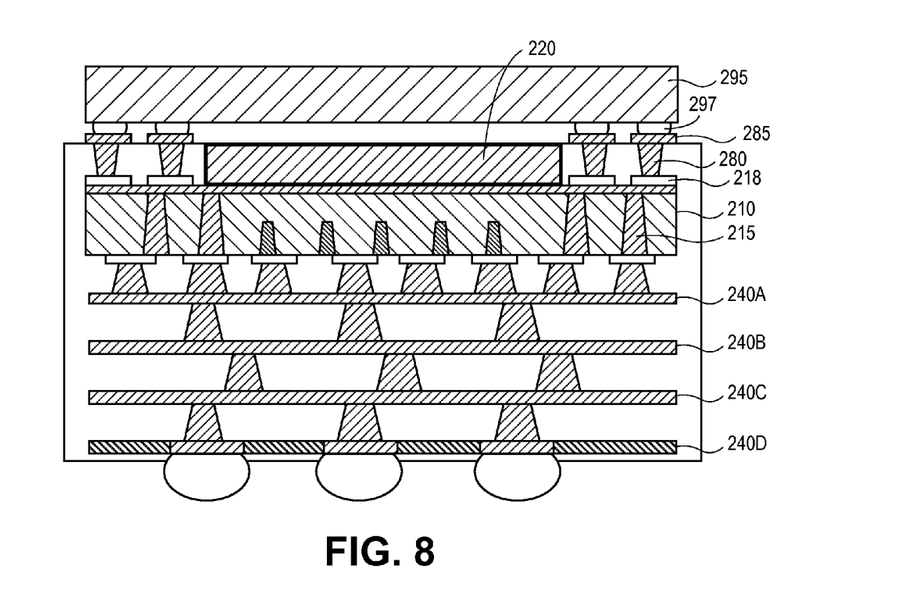
FIG. 8 shows the structure of FIG. 7 following the attachment of a third device to the structure.

FIG. 8 shows the structure of FIG. 7 following the attachment of a third device to the structure. FIG. 8 shows third device 295 of, for example, a memory die or package (e.g., a package including a DRAM device) connected to contact pads 218 through solder material connection 297. Third device 295 is connected through conductive vias 280 to contact pads 218 that are connected to TSVs 215 of die 210.

In the above-described process, a size (area) of second device 220 is less than a size (area) of die 210. In this manner, second device 220 is directly connected to contact points or pads on die 210 and third device 295 is connected with contact pads 285 and directly through a dielectric film to contact pads 218 on a backside surface of die 210 without any routing layer therebetween.

Figure 9:
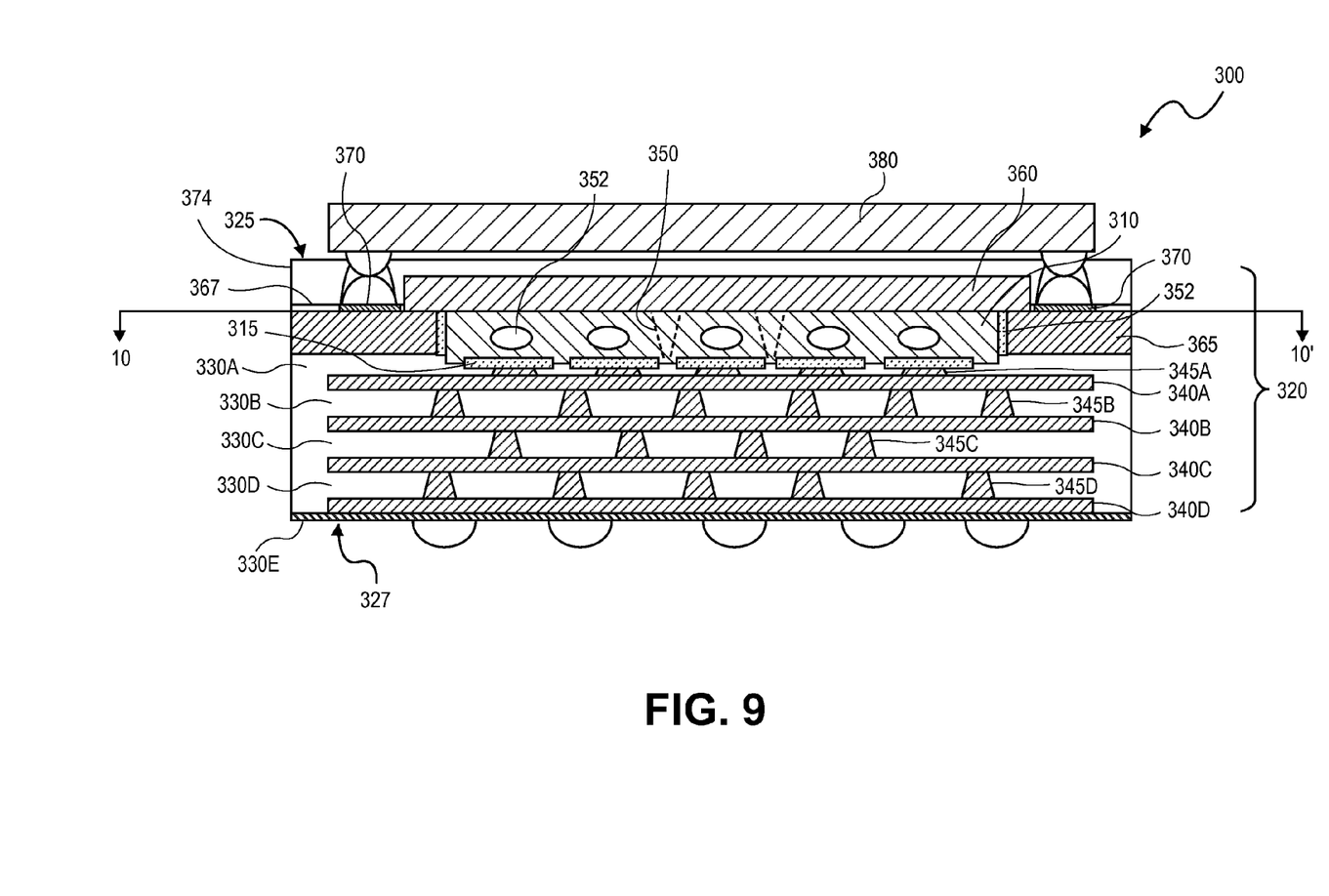
FIG. 9 shows a cross-sectional side view of another embodiment of a microelectronic package.

FIG. 9 shows a cross-sectional side view of another embodiment of a microelectronic package. As illustrated in FIG. 9, microelectronic package 300 utilizes BBUL technology. Microelectronic package 300 includes carrier 320 having surface 325 and opposing surface 327. Die 310, such as a microprocessor die (e.g., a system on chip die) is embedded in carrier 320. In this manner, die 310 and carrier 320 are in direct physical contact with each other (e.g., there are no solder bumps connecting die 310 to carrier 320). Die 310 is directly connected to carrier 320 at its device side (device side down as viewed). Carrier 320, in this embodiment, includes multiple build-up layers of conductive material (e.g., patterned conductive lines or traces) separated by dielectric material. The layers of conductive material (e.g., conductive material 340A, conductive material 340B, conductive material 340C and conductive material 340D) are disposed between layers of dielectric material (dielectric material 330A, dielectric material 330B, dielectric material 330C, dielectric material 330D and dielectric material 330E). The various conductive layers are connected to die 310 (e.g., to contact points on a device side of die 310) and to one another where desired by conductive vias (e.g., conductive vias 345A, conductive vias 345B, conductive vias 345C and conductive vias 345D).

In the embodiment shown in FIG. 9, die 310 is a TSV die. FIG. 9 shows die 310 having conductive vias 350 (illustrated in dashed lines) that extend from a device side of the die to contacts on a backside of the die. In this manner, a second device or devices such as a logic device or memory device may be connected to die 310 through the contacts on the backside of the die. In one embodiment, such contacts are arranged and configured for connection to (operable to connect to) a memory die in a wide I/O configuration. FIG. 9 shows second device 360 that is, for example, a DRAM die connected to contacts on a backside of die 310 in a wide I/O memory configuration. The connection is representatively by way of solder material.

In addition to having contacts on a backside of die 310, die 310 also includes sidewall contacts 352 at or extending from one or more sidewalls of the die. Sidewall contacts 352 allow for connection of an additional device (a third device or devices) through, for example, connections to routed traces from the sidewall contacts. In one embodiment, sidewall contacts 352 are connected to traces from a device side and/or a backside of die 310. FIG. 9 shows conductive material 365 of patterned traces connected to respective ones of sidewall contacts 352 and extending laterally (as viewed) from the respective contacts.

Figure 10:
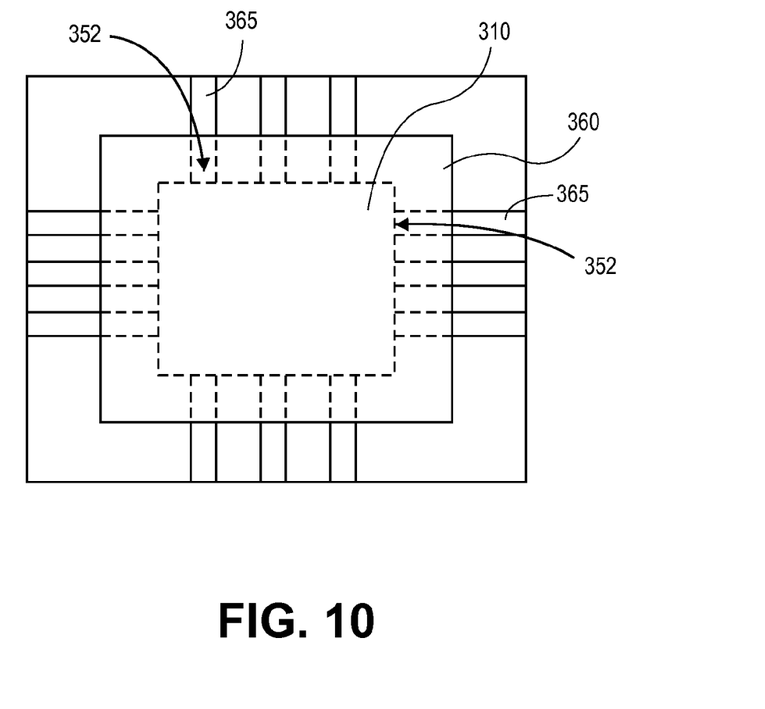
FIG. 10 shows a top view of the microelectronic package of FIG. 9 through line 10-10'.

The routing of traces from sidewall connections of die 310 allows an additional device or devices to form part of a microelectronic package, even where second device 360 has the greater size (e.g., occupied the greater area) than die 310. As illustrated in FIG. 9, traces of conductive material 365 may be routed from respective ones of sidewall contacts 352 to an area of the package outside of an area by second device 360. FIG. 10 shows a top view of the structure through line 10-10' of FIG. 9. As illustrated in FIG. 10, second device 360 has an area greater than an area of die 310 (die 310 shown in dashed lines beneath second device 360). Conductive material 365 is routed laterally from sidewall contacts 352 a distance beyond a perimeter of second device 360.

Referring again to FIG. 9, overlying the disposed conductive material 365 is dielectric material 367 of, for example, an ABF film. FIG. 9 also shows contacts 370 connected to conductive material 365. Contacts 370 are, for example, copper contacts formed as described above (e.g., forming an opening in dielectric material 367, seeding the opening, plating copper material in the opening and on a superior surface of dielectric material 367, and removing any mask and undesired seeding material).

Overlying dielectric layer 367 is embedding material 374 of, for example, an epoxy (e.g., CEL-9740HF, commercially available from Hitachi Chemical Co., Ltd. of Tokyo, Japan). Openings are formed through embedding material 374 to contacts 370. FIG. 9 shows third device 380 of, for example, a memory die or a package including a memory die connected to contacts 370 through solder material connections.

Figure 11:
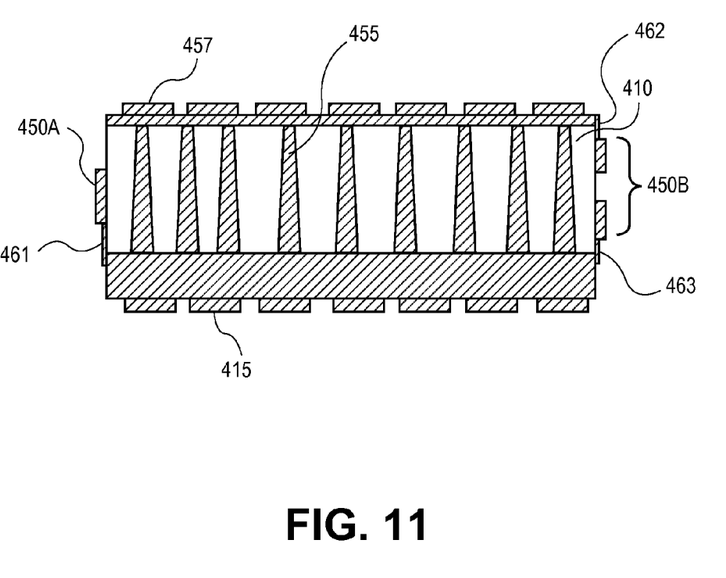
FIG. 11 shows a cross-sectional side view of a die having sidewall contacts.

FIG. 11 shows a cross-sectional side view of a die having sidewall contacts. Die 410 includes a device side including contacts 415. Die 410 is a TSV dice and includes throughsubstrate vias 455 extending from a device side to a backside of the die. Die 410 includes contacts 457 on a backside of the die. The contacts on a backside of each die are connected to through through-silicon vias to a front side of the die.

FIG. 11 shows sidewall contacts 450A and contacts 450B on opposing sidewalls of die 410. As illustrated, sidewall contact 450A is connected to a device side of die 410 (a conductive contact point on device side) by trace 461 (e.g., a plated trace). FIG. 11 shows die 410 having on a right side (as viewed) two rows of sidewall contacts represented by reference numeral 450B. Sidewall contacts 450B, in the illustrated embodiment, are respectively connected to conductive contact points on a backside and a device side of die 310 by trace 462 and trace 463, respectively. The number of rows of sidewall contacts will depend, in one aspect, on the desired number of connections and a thickness of the die. In one embodiment, the forming of sidewall contacts and routing of traces from a device side or a backside of a die may be done at a die fabrication stage (e.g., after a die is singulated) or the packaging stage.

Figure 12:
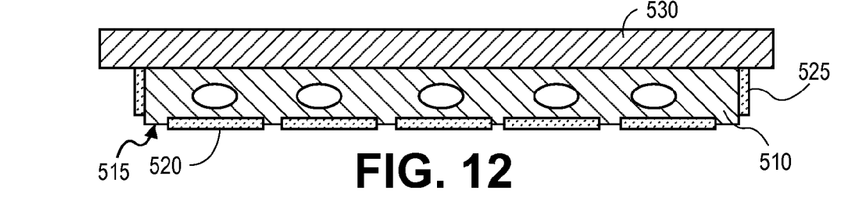
FIG. 12 shows a side view of a TSV die having sidewall contacts and a second device connected to the backside of the die.

FIGS. 12-16 describe an embodiment of a process of forming a structure of microelectronic package similar to that of microelectronic package of FIG. 9. FIG. 12 shows die 510 of, for example, a microprocessor (e.g., a system on chip die). Die includes device side 515 including a number of contacts 520. Die 510 is also a TSV die and includes conductive vias from a device side of the die to a backside. Die 510 further includes sidewall contacts 525 disposed, in this embodiment, on each sidewall portion of the die. Sidewall contacts 525 are formed at the die fabrication stage. FIG. 12 also shows second device 530 such as a memory die connected to die 510 through contacts on a backside of die 510. In one embodiment, second device 530 is a memory die and contacts are arranged and configured for a wide I/O configuration. One representative connection method of connecting second device 530 of a memory die to contacts on a backside of die 510 is through solder material connections.

Figure 13:
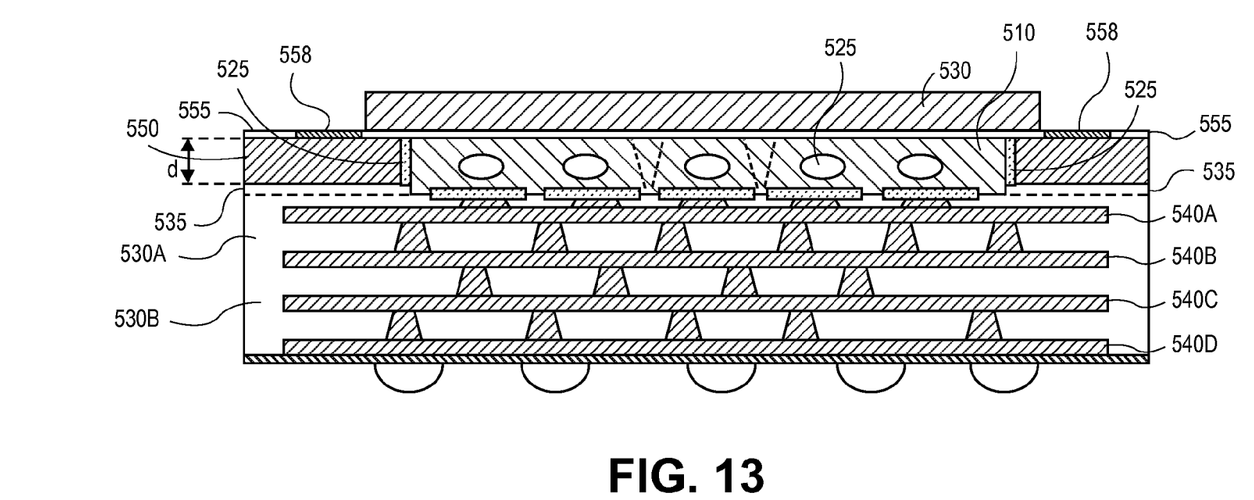
FIG. 13 shows the structure of FIG. 12 following the formation of a portion of a package on a device side of the die.

FIG. 13 shows the structure of FIG. 12 following the formation of a portion of a package. In one embodiment, the package portion includes four layers of conductive material (e.g., conductive traces on a device side of die 510) each separated by dielectric material to provide conductivity to die 510 and link die 510 to an external device or structure (e.g., a printed circuit board). A BBUL process may be used to form the conductive material layers. FIG. 13 shows four conductive layers, lines or traces (conductive material 540A, conductive material 540B, conductive material 540C and conductive material 540D) built up from a device side (device side 515) of die 510. In one embodiment of a BBUL process, a film of dielectric material such as an ABF is initially introduced on device side 515 of die 510. Laser vias are then drilled through the dielectric material to contacts 520 of die 510. The vias are then desmeared and electroless copper is introduced on a surface of the dielectric material. A sacrificial material such as a dry film resist is then introduced and patterned on the electroless copper to define a routing layer or traces (routing layer or traces of conductive material 540A). The sacrificial material is then stripped followed by a flash etch to remove electroless copper between traces. The abovedescribed sequence is carried out multiple times until all desired build-up layers are completed (e.g., layers of conductive material 540B, conductive material 540C and conductive material 540D are introduced and patterned). FIG. 13 shows layers of conductive materials 540A-540B set up respectively between dielectric material 530A, dielectric material 530B, dielectric material 530C and dielectric material 530D, each of, for example, an ABF film. Dielectric material of, for example, is a solder dielectric film 530E may be laminated and patterned using lithography techniques to define openings for solder material to, for example, conductive material layer 540D.

In addition to the build-up layers on device side of die 510, FIG. 13 also shows conductive material 550 as routed traces from sidewall contacts 525 of die 510. Initially, a dielectric film of, for example, ABF may be introduced on dielectric material 530A, the dielectric film having a thickness equivalent to a distance between a sidewall contact and a device side of the die. FIG. 13 shows dielectric material 535 of, for example, ABF disposed on dielectric material 530A. Overlying dielectric material 535 is conductive material 550. Conductive material 550 may be introduced as described above, such as by seeding an area of dielectric material 535 with electroless copper, patterning a masking material to define routing traces from sidewall contacts 525 and electroplating copper to form the traces and finally removing the sacrificial material and any undesired electroless copper. In one embodiment, conductive material 550 is formed to a thickness equivalent to a diameter, d, of sidewall contacts 525. Overlying conductive material 550 in FIG. 13 is a dielectric material such as an ABF film. Collectively, dielectric film 555, conductive material 550 and optional dielectric material 535 encompass or have a thickness at least equivalent to the sidewall thickness of die 510 and, in the embodiment shown in FIG. 13, to a thickness greater than a sidewall thickness of die 510. Following the introduction of dielectric material 555, openings are made through the dielectric material and contacts 558 are formed to conductive material 550 for connection of a third device. The contacts may be formed such as described above.

Figure 14:
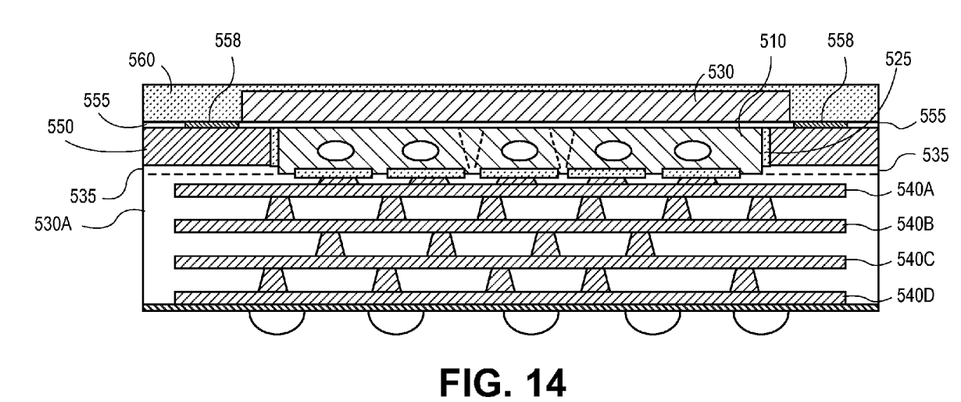
FIG. 14 shows the structure of FIG. 13 following the introduction of an embedding material on the structure.

FIG. 14 shows the structure of FIG. 13 following the introduction of an embedding material on the structure. In one embodiment, embedding material 560 is, for example, a dielectric material such as an epoxy or other mold compound that is introduced as a liquid and allowed to solidify (e.g., solidifying in presence of heat). Embedding material 560 has a thickness greater than a thickness of second device 530 and therefore embeds second device 530 (e.g., at least surrounds the sidewall portions and, in the embodiment shown, is disposed on a top surface of second device 530 (as viewed)).

Figure 15:
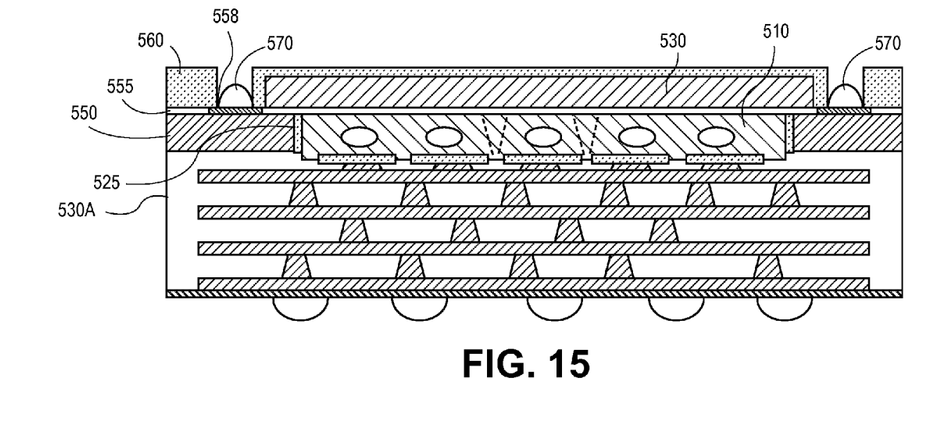
FIG. 15 shows the structure of FIG. 14 following the exposure of contacts through the embedding material.

FIG. 15 shows the structure of FIG. 14 following the exposure of contacts 558 through embedding material 560. In one embodiment, contacts 558 may be exposed by a laser drilling process, wherein the process forms openings to contacts 558 using electromagnetic radiation. FIG. 15 also shows the introduction of solder material 570 on contacts 558.

Figure 16:
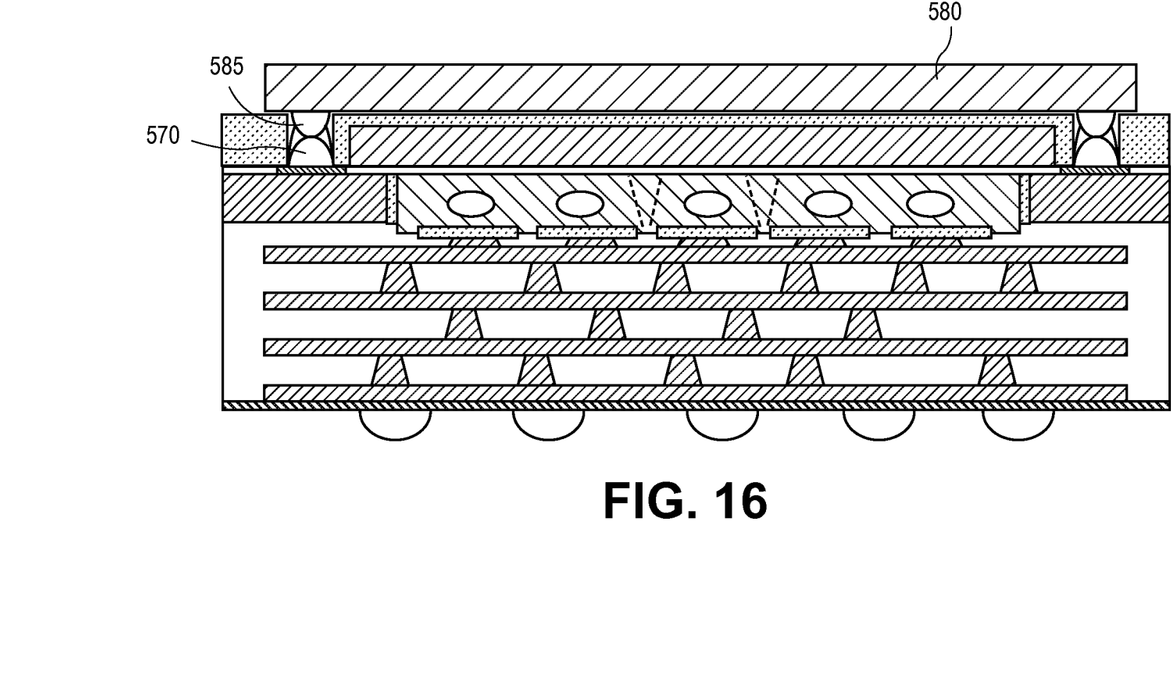
FIG. 16 shows the structure of FIG. 15 following the connection of a third device to the structure.

FIG. 16 shows the structure of FIG. 15 following the connection of third device 580 to the structure. In one embodiment, third device 580 is a package including a memory die (e.g., a DRAM memory die or dice). Third device 580 includes a number of contact points or pads. FIG. 16 shows solder material 585 introduced on the contact points or pads. Once solder material 585 is introduced, third device 580 is connected to the structure through the connection of solder material 585 to solder material 570 and, for example, a reflow process.

Figure 17:
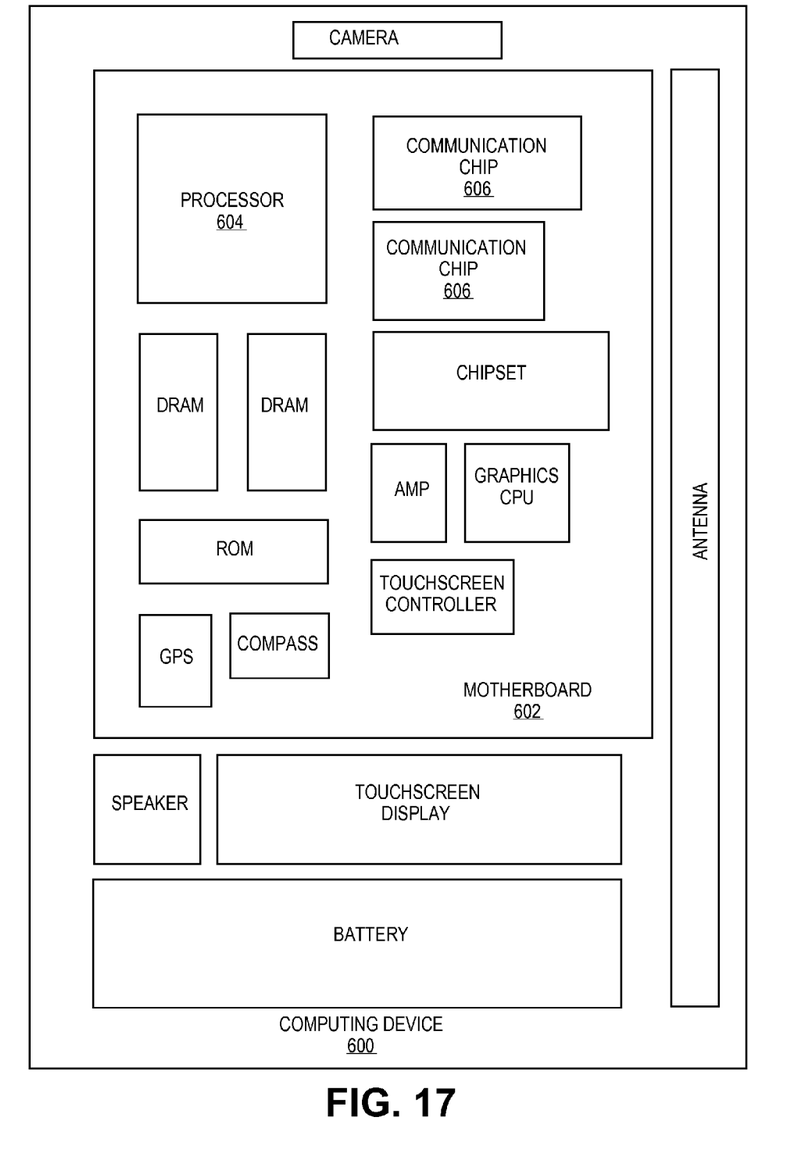
FIG. 17 illustrates computing device in accordance with one implementation of the invention.

FIG. 17 illustrates a computing device 600 in accordance with one implementation. The computing device 600 houses board 602. Board 602 may include a number of components, including but not limited to processor 604 and at least one communication chip 606. Processor 604 is physically and electrically connected to board 602. In some implementations at least one communication chip 606 is also physically and electrically connected to board 602. In further implementations, communication chip 606 is part of processor 604.

Depending on its applications, computing device 600 may include other components that may or may not be physically and electrically connected to board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Representatively, processor 604 is a system on chip and is packaged in a microprocessor package assembly such as described above with a DRAM die connected to a backside of processor 604 in a wide I/O configuration and another memory device (e.g., a DRAM device) also connected to the package.

Communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Communication chip 606 also includes an integrated circuit die packaged within communication chip 606 such as described above.

In further implementations, another component housed within computing device 600 may contain a microelectronic package including an integrated circuit die such as described above.

In various implementations, computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 600 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. An apparatus comprising:
a die comprising a device side and an opposite backside, a first plurality of contacts on the backside and a plurality of through vias from the device side to the first plurality of contacts and a different second plurality of contacts on one of the backside of the die and on at least two opposing sidewalls of the die;
a secondary die coupled to the first plurality of contacts; and
a carrier comprising on a device side of the die at least one patterned layer of conductive material disposed in a first dielectric material, a first plurality of carrier contact points operable for mounting the carrier to a substrate, and a second plurality of carrier contact points on a side opposite a side of the first plurality of carrier contact points, at least ones of the second plurality of carrier contact points coupled to the second plurality of contacts of the die, wherein the carrier comprises a second dielectric material disposed between respective ones of the second plurality of contacts of the die and the second plurality of carrier contact points, the second dielectric material embedding at least opposing sides of the secondary die.

2. The apparatus of claim 1, further comprising a tertiary die coupled to the second plurality of contacts.

3. The apparatus of claim 1, wherein the second plurality of contacts of the die are on at least two opposing sidewalls of the die.

4. The apparatus of claim 1, wherein the secondary die is a wide I/O memory die.

5. The apparatus of claim 1, wherein the carrier has an area greater than an area of the die and the die comprises sidewall contacts on at least two opposing sidewalls, the carrier further comprising a second plurality of contact points.

6. An apparatus comprising:
a die comprising a device side and an opposite backside, a first plurality of contacts on the backside and a plurality of through vias from the device side to the first plurality of contacts and a different second plurality of contacts on one of the backside of the die and on at least two opposing sidewalls of the die;
a secondary die coupled to the first plurality of contacts;
a carrier comprising on a device side of the die at least one patterned layer of conductive material disposed in a first dielectric material, a first plurality of carrier contact points operable for mounting the carrier to a substrate, and a second plurality of carrier contact points on a side opposite a side of the first plurality of carrier contact points, at least ones of the second plurality of carrier contact points coupled to the second plurality of contacts of the die, wherein the carrier comprises a second dielectric material disposed between respective ones of the second plurality of contacts of the die and the second plurality of carrier contact points, the second dielectric material embedding at least opposing sides of the secondary die; and
a tertiary die coupled to the second plurality of contacts.

7. The apparatus of claim 6, wherein the second plurality of contacts are on the backside of the die.

8. The apparatus of claim 6, wherein the second plurality of contacts are on at least two opposing sidewalls of the die.

9. The apparatus of claim 6, wherein the secondary die is a wide I/O memory die.

10. The apparatus of claim 9, wherein the tertiary die is a memory die.

11. The apparatus of claim 6, further comprising a printed circuit board, wherein the first plurality of carrier contact points are coupled to the printed circuit board.

12. The apparatus of claim 6, wherein the carrier has an area greater than an area of the die.

* * * * *